United States Patent
Fong et al.

(10) Patent No.: US 8,642,994 B2
(45) Date of Patent: Feb. 4, 2014

(54) LIGHT EMITTING DIODE ARRAY

(75) Inventors: Wen-Fei Fong, Hsinchu (TW); Der-Lin Hsia, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/584,689

(22) Filed: Aug. 13, 2012

(65) Prior Publication Data
US 2013/0207071 A1 Aug. 15, 2013

(30) Foreign Application Priority Data
Feb. 9, 2012 (TW) .............................. 101104158 A

(51) Int. Cl.
H01L 29/06 (2006.01)
H01L 31/072 (2012.01)

(52) U.S. Cl.
USPC .................... 257/13; 257/79; 438/34; 438/48

(58) Field of Classification Search
USPC ......... 257/13, 79, E21.002, E33.008; 438/34, 438/48
See application file for complete search history.

(56) References Cited

U.S. PATENT DOCUMENTS

| 2011/0012154 A1* | 1/2011 | Okagawa et al. ............... 257/98 |
| 2011/0140160 A1* | 6/2011 | Kim et al. ....................... 257/99 |

* cited by examiner

*Primary Examiner* — Theresa T Doan

(57) ABSTRACT

A light emitting diode (LED) array includes a substrate with an array having a plurality of LED chips thereon, a dielectric layer, a plug, and a conductive connection layer. Each of the LED chips is isolated from another LED chip adjacent thereto by a trench. The dielectric layer covers a surface of the substrate exposed by the trench and sidewalls and partial surfaces of the LED chips adjacent to the trench. The plug fills the trench. The conductive connection layer is disposed over the plug and the dielectric layer to connect the LED chips with the LED chips adjacent thereto. Radiation emitted from one of the LED chips can be reflected by the dielectric layer and the plug, and finally reflected and output from a side of the LED chip not adjacent to the trench, thereby not affecting the adjacent LED chip and being absorbed by it.

12 Claims, 4 Drawing Sheets

… (US 8,642,994 B2)

LIGHT EMITTING DIODE ARRAY

CROSS REFERENCE TO RELATED APPLICATIONS

This Application claims priority of Taiwan Patent Application No. 101104158, filed on Feb. 9, 2012, the entirety of which is incorporated by reference herein.

BACKGROUND OF THE INVENTION

1. Field of the Invention

The present invention relates to a light emitting device, and in particularly to a light emitting diode array.

2. Description of the Related Art

LEDs are used in diverse lighting applications and can be used to provide radiation across visible, ultraviolet and/or infrared wavelengths. Such applications include displays, printers, communications, and optoelectronic computer interconnects. One type of LED is a III-V group compound semiconductor LED element, for example, a GaN-LED.

However, a plurality of light emitting diodes are needed for providing sufficient brightness in the above applications. Since the plurality of light emitting diodes may operate simultaneously in the above applications, proper light blocking properties between adjacent light emitting diodes are needed to prevent emitted radiation of the light emitting diodes from being absorbed by one of the light emitting diodes adjacent thereto, to maximize radiation (e.g., light) output efficiency.

BRIEF SUMMARY OF THE INVENTION

An exemplary light emitting diode (LED) array comprises a substrate having an array comprising a plurality of light emitting diode (LED) chips disposed thereon, a dielectric layer, a plug, and a conductive connection layer. In one embodiment, each of the LED chips is isolated from another LED chip adjacent thereto by a trench, and each of the LED chips comprises: a buffer layer; a first type semiconductor layer over the buffer layer, having a relatively higher second platform area and a relatively lower first platform area; an active layer over the second mesa area; a second type semiconductor layer over the active layer; a first type electrode over the first platform area; and a second type electrode over the second type semiconductor layer. The dielectric layer covers a surface of the substrate exposed by the trench, sidewalls of the LED chips, and portions of the first semiconductive layer and the second type semiconductor layer adjacent to the trench, and exposes the first type electrode and the second electrode. The plug fills the trench and is disposed over the dielectric layer, and is surrounded by the dielectric layer. The conductive connection layer is over the plug and the dielectric layer to connect the first type electrode of each of the LED chips with the second type electrode of the LED chips adjacent thereto.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1-4 are schematic diagrams showing a method for fabricating a light emitting diode (LED) array according to an embodiment of the invention. The light emitting diode (LED) array fabricated by the above method can be formed with improved radiation (e.g., light) output efficiency.

Figure 1:
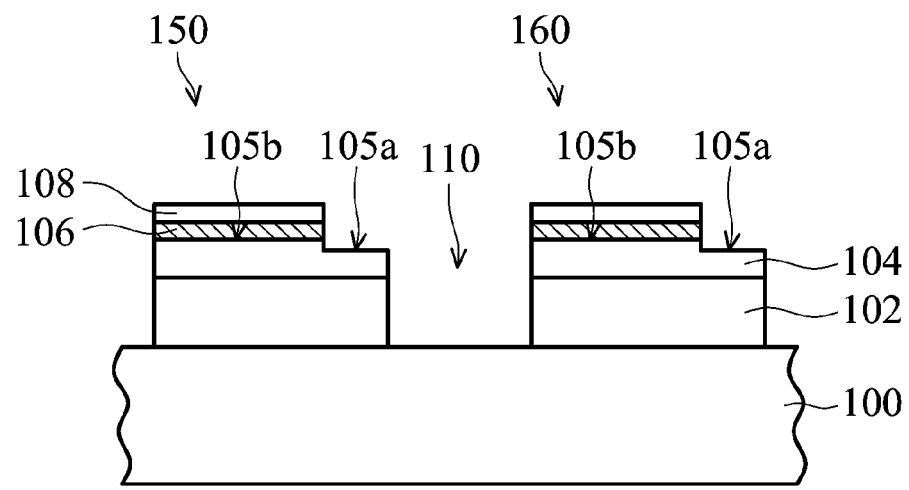
FIGS. 1-4 are schematic diagrams showing a method for fabricating a light emitting diode (LED) array according to an embodiment of the invention.

In FIG. 1, a substrate 100 is first provided, having a plurality of light emitting diode (LED) chips formed thereover. For the purpose of simplicity, only two adjacent LED chips 150 and 160 are illustrated in FIG. 1. In one embodiment, the substrate 100 can be, for example, a sapphire substrate or a silicon-containing substrate. The LED chips 150 and 160 are separately formed over a portion of the substrate 100, and are sequentially arranged as an array configuration. As shown in FIG. 1, the adjacent LED chips 150 and 160 are isolated from each other by a trench 110, and the trench 110 exposes a portion of a top surface of the substrate 100.

Still referring to FIG. 1, the LED chips 150 and 160 are simultaneously formed over various portions over the top surface of the substrate 100 by conventional LED chip fabrication methods (not shown). The LED chips 150 and 160 comprise a buffer layer 102 formed over a portion of the substrate 100, a first type semiconductor layer 104, an active layer 106, and a second type semiconductor layer 108, respectively. Herein, the first type semiconductor layer 104 is a nonplanar film layer, comprising a relatively lower first platform area 105a and a relatively higher second platform area 105b. The active layer 106 and the second type semiconductive layer 108 are sequentially formed over the first platform area 105a if the first type semiconductor layer 104. In one embodiment, the buffer layer 104 may comprise materials selected from a group consisting of GaN, AlN, AlIn, AlGaN, InGaN, AlInN and AlInGaN. The first type semiconductor layer 104 and the second type semiconductor layer 108 may comprise materials such as gallium-comprising nitride. The active layer 106 may comprise materials such as gallium-comprising nitride, and may comprise a plurality of quantum well structured layers (not shown). In one embodiment, the first type semiconductor layer 104 can be a P-type semiconductor layer, and the second type semiconductor layer 108 can be an N-type semiconductor layer. Alternatively, in another embodiment, the first type semiconductor layer 104 can be an N-type semiconductor layer, and the second type semiconductor layer 108 can be a P-type semiconductor layer.

Figure 2:
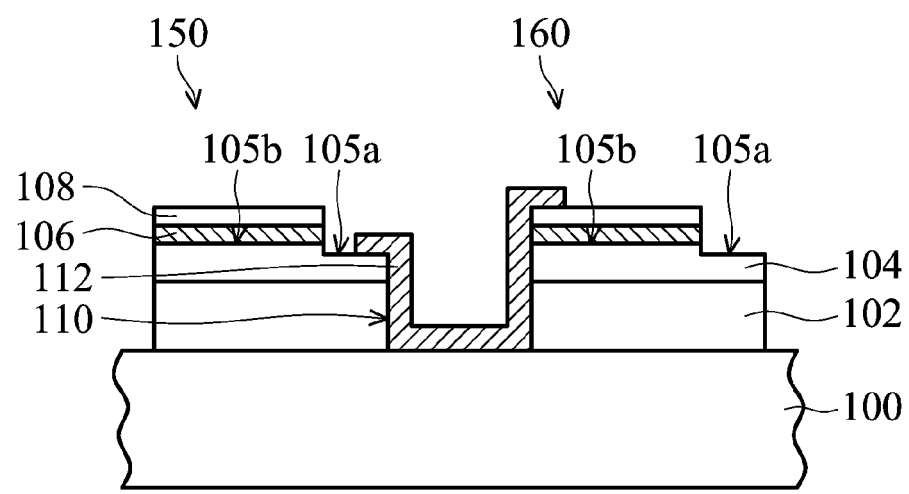

In FIG. 2, a layer of dielectric layer (not shown) is conformally deposited over the substrate 100 and the LED chips 150 and 160, and is then patterned by a patterning process (not shown), thereby forming a dielectric layer 112 in the trench 110. The dielectric layer 112 covers a surface of the substrate 100 exposed by the trench 110 and also covers a portion of the LED chips 150 and 160 adjacent to the trench 110.

As shown in FIG. 2, the dielectric layer 112 covers the entire surface of the substrate 100 in the trench 110 and covers a portion of the LED chips 150 and 160 adjacent to the trench 110, such as covering a portion of surfaces of the first platform area 105a of the first type semiconductor layer 104 of the LED chip 150, sidewalls of the first type semiconductor layer 104 and the active layer 102 of the LED chip 150, sidewalls of the first type semiconductor layer 104, the buffer layer 102, the active layer 106 and the second type semiconductor layer 108 of the LED chip 160, and portions of the surface of the second type semiconductor layer 108 above the second platform area 105b of the first type semiconductor layer 104 of the LED chip 160. The dielectric layer 112 may comprise materials selected from a group consisting of silicon dioxide, silicon nitride, silicon oxynitride, and aluminum oxide.

Figure 3:
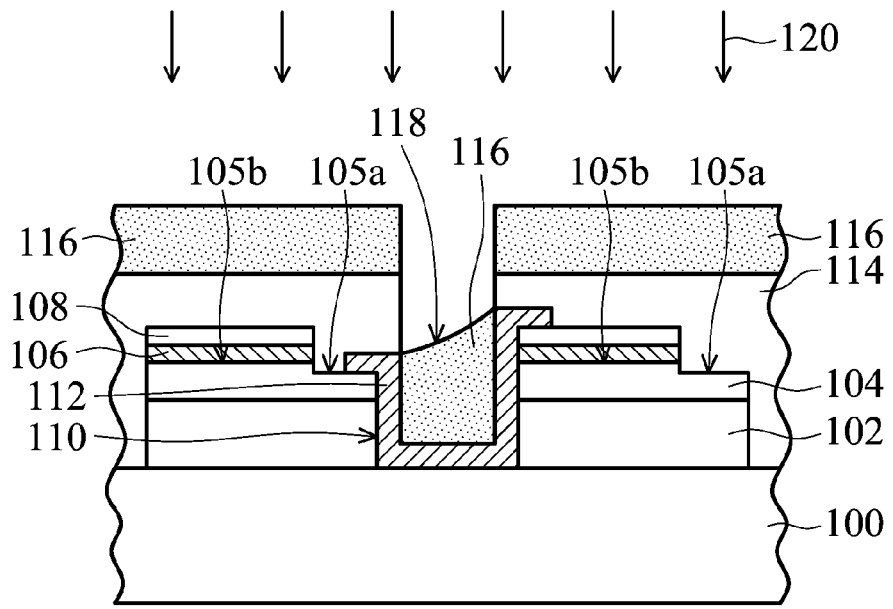

In FIG. 3, a layer of resist material, for example a negative-type photoresist material, is then blanketly formed over the substrate 100 to blanketly cover the LED chips 150 and 160, and the substrate 100. Next, a patterning process (not shown) is performed to pattern the layer of resist material and the trench 110 is again exposed, thereby forming a patterned resist layer 114 over the substrate 100.

As shown in FIG. 3, the patterned resist layer 114 cover the LED chips 150 and 160, and portions of the substrate 100. Next, a deposition process 120 is performed to blanketly deposite a reflective material 116 over the substrate 100. Herein, the deposition process 120 can be, for example, a sputtering process or an evaporating process. The deposited reflective material 116 may comprise materials selected from a group consisting of Al, Ag, Ti, Pt, Rh, Pd, Ir, Si and Zn. The reflective material 116 may show a reflective index of 80% against radiation (not shown) emitted from the LED chips 150 and 160.

As shown in FIG. 3, after the deposition process 120, the reflective material 116 partially fills the trench 110 and blanketly forms over the patterned resist layer 114. The reflective material 116 formed in the trench 110 may have a curved top surface 118, and the top surface 118 is not higher than a top surface of the dielectric layer 112 covering the adjacent LED chips 150 and 160.

Figure 4:
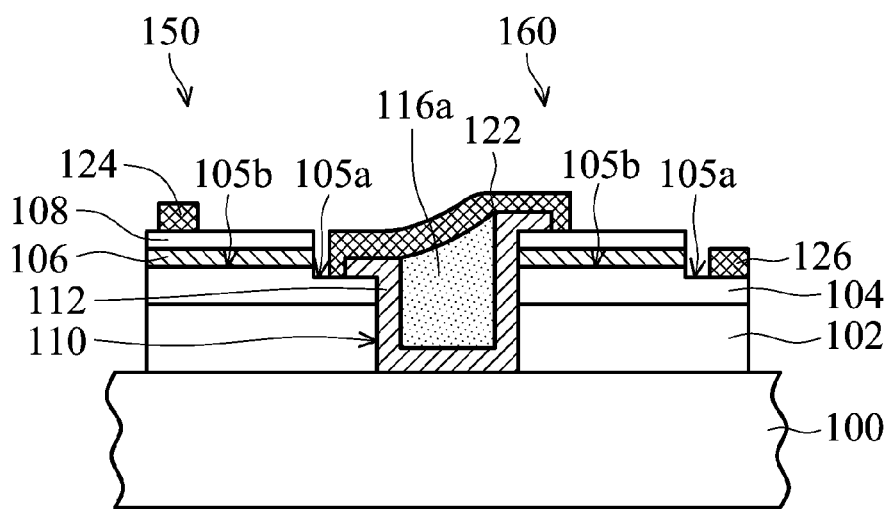

In FIG. 4, a stripping process (not shown) is then performed to remove the resist layer 114 and simultaneously lifts off the portion of the reflective material 116 over the resist layer 114, thereby leaving a plug 116a made of the reflective material 116 in the trench 110. Next, a conductive material (not shown) is deposited and then patterned by a patterning process (not shown), thereby forming a plurality of isolated conductive connection layer 122, conductive layer 124 and conductive layer 126 over the substrate 100.

As shown in FIG. 4, the conductive layer 124 is formed over a portion of the second type semiconductor layer 108 of the LED chip 150, functioning as a second type electrode. The conductive connection layer 122 connects the LED chip 150 with the LED chip 160. More precisely, the connection layer 122 is partially formed over a portion of the first platform area 105a of the first type semiconductor layer 114 of the LED chip 150 to function as a first electrode of the LED chip 150. The connection layer 122 also forms over the plug 116a and the dielectric 112 in the trench 110 and further extends to the LED chip 160 to partially cover a portion of the second type semiconductor layer 108 of the LED chip 160 to function as a second electrode of the LED chip 160. Moreover, the conductive layer 126 is formed over a first platform area 105a of the first type semiconductor layer 104 of the LED chip 160 to function as a first electrode.

Figure 5:
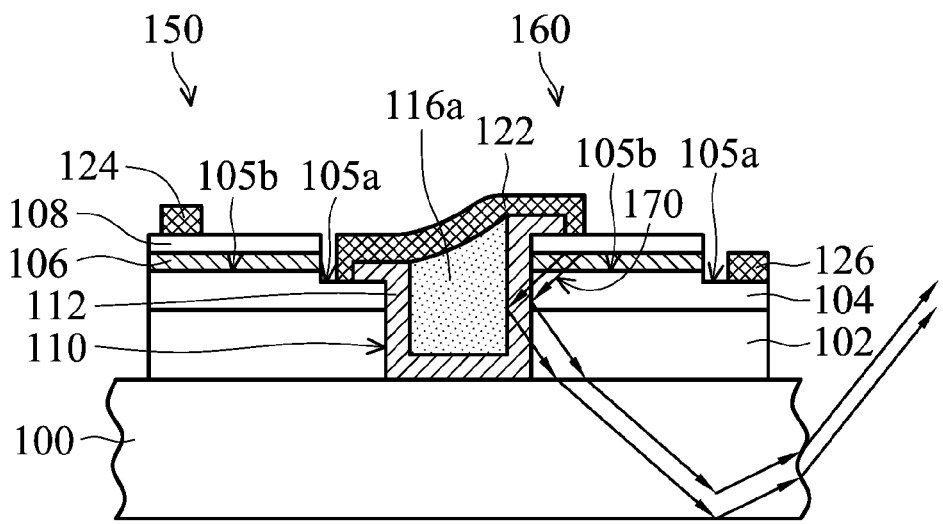
FIG. 5 is a schematic diagram showing an operation of a light emitting diode (LED) array according to an embodiment of the invention.

FIG. 5 is a schematic diagram showing improved radiation output efficiencies during an operation of the light emitting diode array shown in FIG. 4 according to an embodiment of the invention. As shown in FIG. 5, during operation, a portion of the radiation 170 emitted from the active layer 106 of the LED chip 160 in the LED array may can mostly be reflected by the dielectric layer 112 and the plug 116a, and reflected radiation 170 may further pass through the first type semiconductor layer 104 and the buffer layer 102, such that it is finally reflected by the substrate 100 and output from a side of the LED chip 160 not adjacent to the trench 110, thereby not affecting the adjacent LED chip 150 and being absorbed by it. Therefore, the radiation output performances of the LED chip 150 will not be affected and the radiation output efficiency of the LED chip 160 can thus be improved. In addition, due to the plug 116a in the trench 110 may comprising metal material which is highly thermal conductive, heat dissipation efficiencies of the LED chips 150 and 160 can be also improved.

Figure 6:
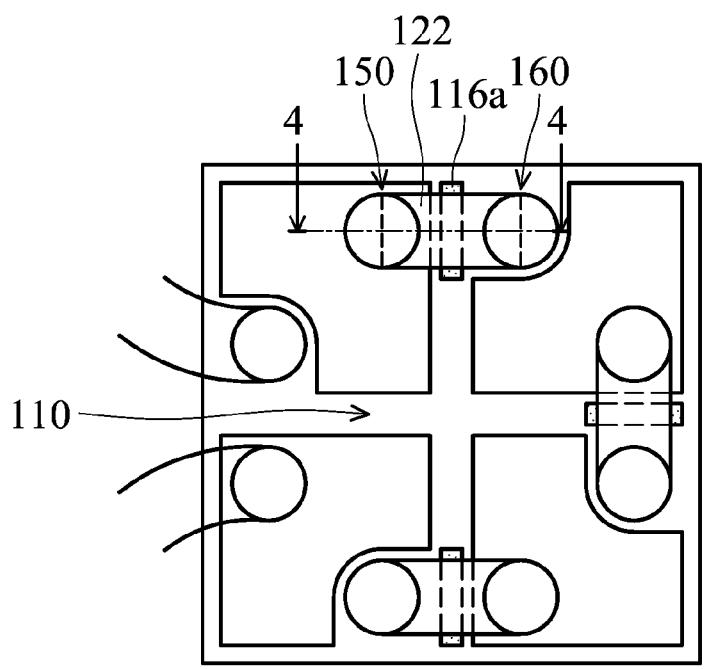
FIG. 6 is a schematic top view showing a light emitting diode (LED) array according to an embodiment of the invention.
Figure 7:
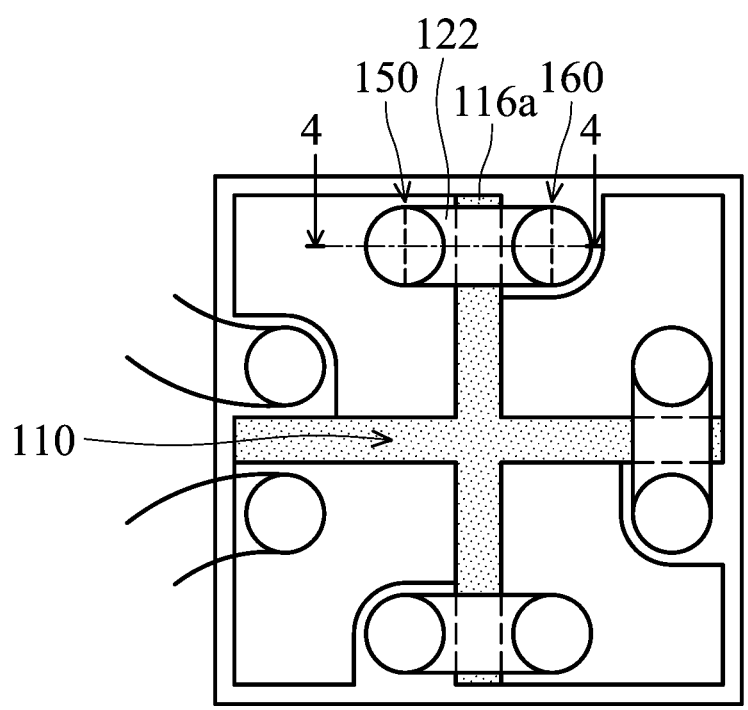
FIG. 7 is a schematic top view showing a light emitting diode (LED) array according to another embodiment of the invention.

FIGS. 6 and 7 are schematic top views showing a light emitting diode array shown in FIG. 4 according to various embodiments of the invention, respectively, wherein a cross section taken along the line 4-4 illustrates the light emitting diode array shown in FIG. 4.

As shown in FIG. 6, in this embodiment, the plug 116 is merely formed in a portion of the trench 110 to isolate the LED chips 150 and 160, and other portions of the trench 110 are not filled with the plug 116a. The surface of the substrate 100 in the portions of the trench 110 not filled by the plug 116a will be exposed by the trench 110.

Alternatively, as shown in FIG. 7, the plug 116a may entirely fill the trench 110 for isolating the LED chips 150 and 160, such that a top surface of the substrate 100 under the trench 110 will not be exposed.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode array, comprising:
    a substrate having an array comprising a plurality of light emitting diode (LED) chips disposed thereon, wherein each of the LED chips is isolated from another LED chip adjacent thereto by a trench, and each of the LED chips comprises:
        a buffer layer;
        a first type semiconductor layer over the buffer layer, having a relatively higher second platform area and a relatively lower first platform area;
        an active layer over the second mesa area;
        a second type semiconductor layer over the active layer;
        a first type electrode over the first platform area; and
        a second type electrode over the second type semiconductor layer;
    a dielectric layer covering a surface of the substrate exposed by the trench, sidewalls of the LED chips, and portions of the first semiconductive layer and the second type semiconductor layer adjacent to the trench, exposing the first type electrode and the second electrode;
    a plug filling the trench and disposed over the dielectric layer and surrounded by the dielectric layer; and a conductive connection layer over the plug and the dielectric layer to connect the first type electrode of each of the LED chips with the second type electrode of the LED chips adjacent thereto.

2. The LED array as claimed in claim 1, wherein the plug is formed of a reflective material partially or entirely filling a space in the trench.

3. The LED array as claimed in claim 1, wherein the active layer shows a reflective index greater than 80% against radiation emitted from the LED chips.

4. The LED array as claimed in claim 1, wherein the plug comprises a material selected from a group consisting of Al, Ag, Ti, Pt, Rh, Pd, Ir, Si and Zn.

5. The LED array as claimed in claim 4, wherein the dielectric layer comprises a material selected from a group consisting of silicon dioxide, silicon nitride, silicon oxynitride, and aluminum oxide.

6. The LED array as claimed in claim 5, wherein the conductive connection layer comprises a material selected from a group consisting of Au, Ag, Ni, Pt and an alloy thereof.

7. The LED array as claimed in claim 1, wherein the first and second semiconductor layer comprise gallium-comprising nitride.

8. The LED array as claimed in claim 7, wherein the buffer layer comprises materials selected from a group consisting of GaN, AlN, AlIn, AlGaN, InGaN, AlInN and AlInGaN.

9. The LED array as claimed in claim 8, wherein the active layer comprises gallium-comprising nitride.

10. The LED array as claimed in claim 9, wherein the active layer further comprises a plurality of quantum well structured layers.

11. The LED array as claimed in claim 1, wherein the first type is a P-type and the second type is an N-type, or the first type is an N-type and the second type is a P-type.

12. The LED array as claimed in claim 1, wherein the substrate is a sapphire substrate or a silicon-containing substrate.

* * * * *